(12) United States Patent
Wang et al.

(10) Patent No.: US 10,818,370 B1
(45) Date of Patent: Oct. 27, 2020

(54) HEALTH MONITORING FOR CAPACITOR ARRAY IN STORAGE DEVICES

(71) Applicant: SK hynix Inc., Gyeonggi-do (KR)

(72) Inventors: Wenwei Wang, San Jose, CA (US); Bin Li, San Jose, CA (US); Satish Pratapneni, Milpitas, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/570,000

(22) Filed: Sep. 13, 2019

(51) Int. Cl.
*G11C 29/02* (2006.01)
*G11C 29/50* (2006.01)
*G11C 11/56* (2006.01)
*G06F 11/30* (2006.01)
*G06F 11/07* (2006.01)
*G11C 11/4074* (2006.01)

(52) U.S. Cl.
CPC ........ *G11C 29/021* (2013.01); *G06F 11/0772* (2013.01); *G06F 11/3037* (2013.01); *G11C 11/4074* (2013.01); *G11C 11/565* (2013.01); *G11C 29/50004* (2013.01); *G11C 2029/5006* (2013.01)

(58) Field of Classification Search
None
See application file for complete search history.

(56) References Cited

U.S. PATENT DOCUMENTS

| | | | | |
|---|---|---|---|---|
| 5,598,366 A | * | 1/1997 | Kraus | G11C 11/22 365/145 |
| 6,330,297 B1 | * | 12/2001 | Kano | G11C 29/12 324/527 |
| 6,812,716 B2 | * | 11/2004 | Fawcett | G01R 27/2694 324/521 |
| 7,451,348 B2 | | 11/2008 | Pecone et al. | |
| 8,421,469 B2 | * | 4/2013 | Hermann | G01R 31/3865 324/434 |
| 8,514,565 B2 | | 8/2013 | Foo et al. | |
| 9,214,198 B2 | | 12/2015 | Ellis et al. | |
| 9,430,011 B2 | | 8/2016 | Chiasson et al. | |
| 9,646,657 B2 | | 5/2017 | Schmidt et al. | |
| 9,966,780 B2 | | 5/2018 | Sherstyuk et al. | |
| 2018/0181184 A1 | | 6/2018 | Ye | |
| 2019/0162797 A1 | | 5/2019 | An et al. | |

* cited by examiner

*Primary Examiner* — Tan T. Nguyen
(74) *Attorney, Agent, or Firm* — Kilpatrick Townsend & Stockton LLP

(57) ABSTRACT

Techniques related to monitoring a health of a capacitor array of an SSD are described. In an example, a direct leakage current check is performed by determining voltages of the capacitor array at different times, computing a resistance of the capacitor array based on the voltages, and generating health data for the capacitor array based on the resistance. In another example, an indirect leakage current check is performed by determining at least one of: a number of times a voltage maintaining process is performed within a predefined time duration or a time difference between repeating the voltage maintaining process, comparing the at least one of the number of times or the time difference and a threshold, and generating the health data based on the comparison of the at least one of the number of times or the time difference and the threshold.

20 Claims, 9 Drawing Sheets

HEALTH MONITORING FOR CAPACITOR ARRAY IN STORAGE DEVICES

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND

Solid-state drives (SSDs) are types of storage devices that use NAND flash memory. In NAND flash memory, memory cells can store one or more bits as voltage values. For example, a single level cell stores one bit and the measured voltage value can be compared to a single voltage threshold to determine a logical value of the bit (e.g., a "0" or a "1"). A multi-level cell (MLC) can store two bits and the measured voltage value can be compared to three voltage thresholds to determine the logical value of each bit.

Generally, an SSD is manufactured according to a set of specifications. If there is any violation to the set, the SSD may be considered to have reached its end of life (EOL) and should be replaced. For example, if writing data to or reading data from the NAND flash memory is compromised, EOL may be declared for the SSD.

BRIEF SUMMARY

Techniques related to monitoring a health of a capacitor array of an SSD are described. In an example, the SSD includes a power controller, a capacitor array, and a processor configured to execute instructions that cause the SSD to perform operations. The operations include determining a number of times a voltage maintaining process is performed within a predefined time duration or a time difference between repeating the voltage maintaining process. The voltage maintaining process includes a recharging of the capacitor array by the power controller. The operations also include comparing the at least one of the number of times or the time difference and a threshold. The operations also include disabling the voltage maintaining process, determining, while the voltage maintaining process is disabled, a first voltage of the capacitor array at a first time, and determining, while the voltage maintaining process is disabled, a second voltage of the capacitor array at a second time. The operations also include computing a resistance of the capacitor array based on the first voltage, the second voltage, the first time, and the second time, and generating health data for the capacitor array based on at least one of the resistance or a result of the comparison of the at least one of the number of times or the time difference and the threshold.

In an example, the health data includes the resistance and the least one of the number of times or the time difference. The operations also include comparing the resistance to another threshold and generating an alert indicating a leakage current of the capacitor array based on at least one of the resistance being smaller than the other threshold, the number of times being larger than the threshold, or the time difference being smaller than the threshold.

In an example, determining the first voltage includes measuring the first voltage at a time of disabling the voltage maintaining process. Determining the second voltage includes determining that the first voltage dropped to a predefined voltage level. And a difference between the second time and the first time is measured as an elapsed time. In this example, the resistance is computed as a function of the elapsed time, a capacitor of an ideal capacitor that represents the capacitor array, the first voltage, and the predefined voltage level.

In an example, disabling the voltage maintaining process is based on the comparison of the number of times and the threshold indicating that the number of times is larger than the threshold or the time difference is smaller than the threshold.

In an example, the capacitor array comprises polymer capacitors.

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE DRAWINGS

An understanding of the nature and advantages of various embodiments may be realized by reference to the following figures.

DETAILED DESCRIPTION

Figure 1:
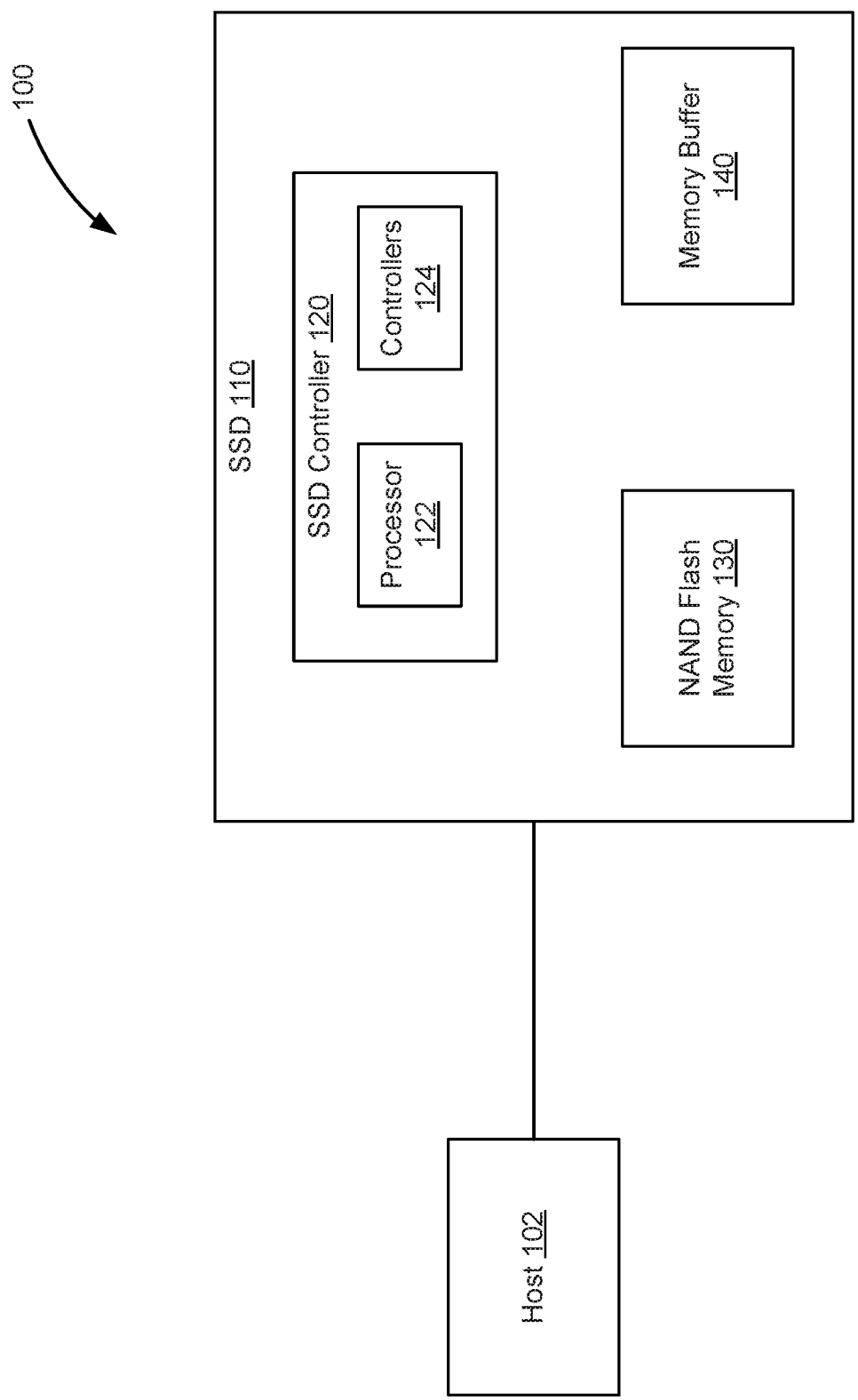
FIG. 1 illustrates an example of a computer system that includes a host and an SSD, in accordance with certain embodiments of the present disclosure.

Techniques related to monitoring a health of a capacitor array of an SSD are described. In an example, embodiments of the present disclosure relate to an SSD that includes a capacitor array for the data protection from power loss, where the capacitor array provides sufficient energy for short amounts of power hold time as needed. However, leakage current my occur within the capacitor array, thereby preventing the capacitor array from storing the needed energy. In such a situation, power protection from power loss may no longer be properly supported potentially impacting the EOL of the SSD. Hence, monitoring the health of the capacitor array becomes important. The embodiments provide a number of techniques for the health monitoring.

A first example technique involves an indirect leakage current check. In this example, the check includes determining a number of times a voltage maintaining process is performed by a power controller of the SSD within a predefined time duration. The voltage maintaining process includes a recharging of the capacitor array of by the power controller. The indirect leakage current check also includes comparing the number of times and a predefined threshold and generating health data for the capacitor array based on the comparison of the number of times and the predefined threshold. The health data can include the number of times and/or a result of the comparison. If the comparison indicates that the number of times is larger than the predefined threshold, an alert can be generated and sent to a host, where the alert indicates (e.g., affirmatively or as likely event) a leakage current. In addition to providing the capability for indicating the leakage current, the indirect leakage current check provides other technical advantages. In particular, the indirect leakage current check does not interrupt the voltage maintaining process and is simple to implement.

A second example technique involves a direct leakage current check. In this example, the check includes disabling the voltage maintaining process and, while the voltage maintaining process is disabled, determining a first voltage of the capacitor array at a first time and a second voltage of the capacitor array at a second time. A resistance of the capacitor array is computed based on the first voltage, the second voltage, the first time, and the second time. The resistance can be compared to another predefined threshold and health data is generated based on the resistance health data for the capacitor array based on the comparison of the number of times and the threshold. The health data can include the resistance and/or a result of the comparison. Generally, the higher the resistance is, the smaller the leakage current is. Hence, if the comparison indicates that the resistance is smaller than the predefined threshold, an alert can be generated and sent to the host, where the alert indicates (e.g., affirmatively or as likely event) a leakage current.

The two example techniques can be used in conjunction. For instance, the indirect leakage current check can performed regularly. Upon detecting that the number of times has become larger than the relevant threshold, the direct leakage current check can be performed. In other words, the indirect leakage current check is usable as a trigger of the direct leakage current check.

In the interest of clarity of explanation, various embodiments of the present disclosure are described in connection with a capacitor array that includes polymer capacitors and in connection with an SSD. However, the embodiments are not limited as such and similarly apply to other types of capacitor arrays and/or storage devices. Generally, a storage device can include a collection of capacitors for data protection from power loss. The indirect leakage current check and/or the direct leakage current check can be performed to generate health data and determine the potential for leakage current in the capacitors.

FIG. 1 illustrates an example of a computer system 100 that includes a host 102 and an SSD 110, in accordance with certain embodiments of the present disclosure. The SSD 110 includes, among other components, an SSD controller 120, a NAND flash memory 130, and a memory buffer 140, such as a double data rate (DDR) synchronous dynamic random-access memory (SRAM). The SSD controller 120 includes, among other components, a processor 122 and a set of controllers 124, such as an input/output (I/O) controller and a power controller. The processor 122 executes instructions, such as software code stored as firmware in the SSD 110, to operate the controllers 124. The operations include, for instance, writing data to the SSD 110 from the host 102 by sending the data to the memory buffer 140 and then from the memory buffer 140 to the NAND flash memory 130. The operations also include, for instance, reading data from the SSD 110 to the host 102 by sending the data from the NAND flash memory 130 to the memory buffer 140 and then from the memory buffer 140 to the host 102.

Generally, the SSD controller 120 manages the data in the NAND flash memory 130 and the communications with the host. In addition, the SSD controller 120 can be configured for wear leveling, error correction and garbage collection.

The NAND flash memory 130 is a type of nonvolatile storage technology that does not require power to retain data. The NAND flash memory 130 includes electric circuits to store the data in blocks. When power is no longer supplied to the NAND flash memory 130, a metal-oxide semiconductor provides an extra charge to the memory cell, keeping the data. The metal-oxide semiconductors typically used include floating-gate transistors (FGT). The FGTs are structured similar to NAND logic gates.

Accordingly, the SSD 110 stores data temporarily in the memory buffer 140 before finalizing the data to the NAND flash array 130 in association with a write command, or sending it to the host 102 in association with a read command. If power loss occurs, thereby interrupting the final write or read, the SSD 110 can crash. One effective way of mitigating the possibility of a crash in the event of a power loss is by implementing a capacitor array as further described in the next figures.

Figure 2:
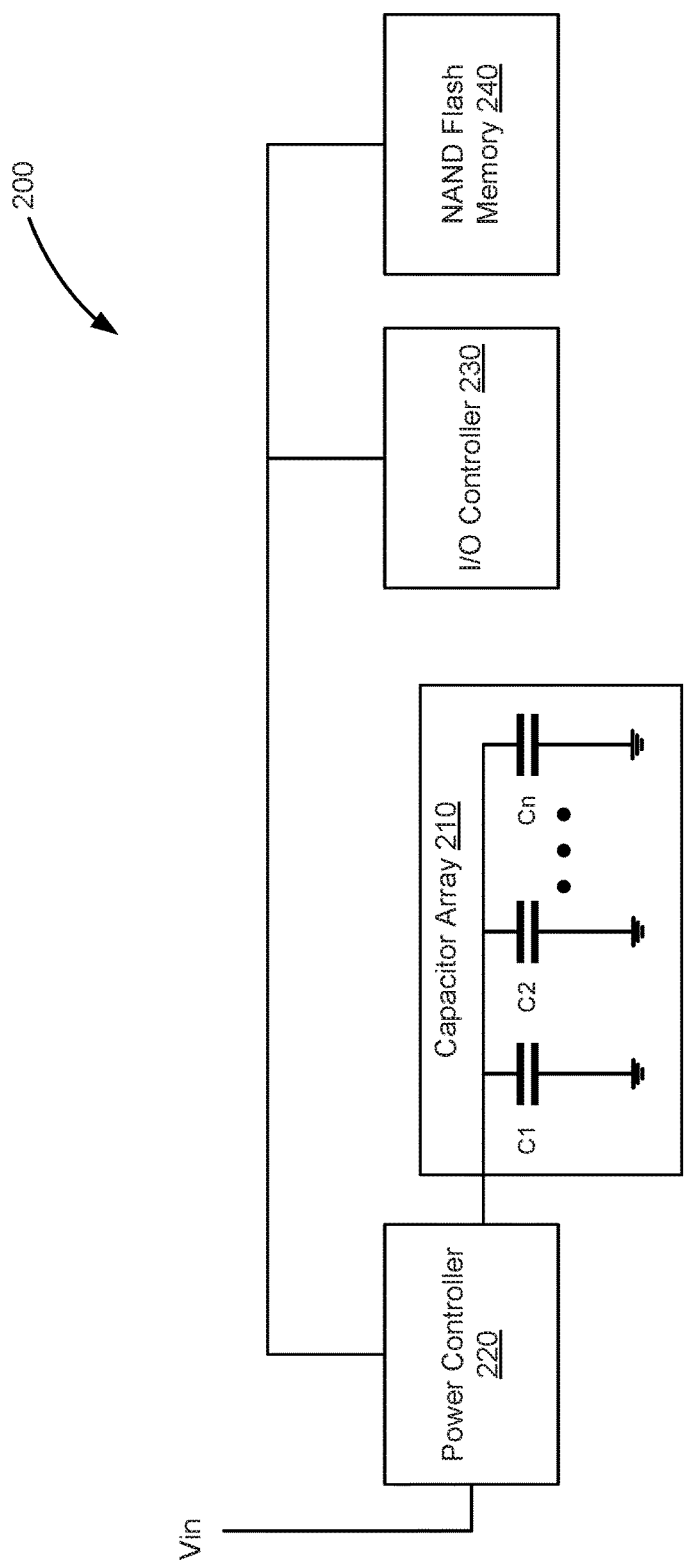
FIG. 2 illustrates an example of an SSD that includes a capacitor array, in accordance with certain embodiments of the present disclosure.

FIG. 2 illustrates an example of an SSD 200 that includes a capacitor array 210, in accordance with certain embodiments of the present disclosure. The capacitor array 210 can be included in or can be separate from an SSD controller of the SSD (e.g., SSD controller 120 of FIG. 1). The SSD controller includes a power controller 220 and an I/O controller 230. The SSD 200 also includes a NAND flash memory 240. The I/O controller 230 writes data to and reads data from the NAND flash memory 240. The power controller 220 manages power to the I/O controller 230 for the write and read operations.

In an example, the power controller 220 provides the power from a power source, such as from a 5 VDC or 12 VDC line (shown in FIG. 2 as "Vin"). In case of a power loss, the power controller 220 electrically couples (e.g., by controlling switches) the capacitor array 210 with the I/O controller 230 such that power is supplied from the capacitor array 220 for an amount of power hold time (e.g., in the microseconds or milliseconds) such that the I/O controller 230 can complete writes, reads, and/or any shutdown procedures. In both cases, the power controller 220 can control step-up and step-down DC converters to supply the proper power to the I/O controller 230.

The capacitor array 210 includes a set of polymer capacitors (shown in FIG. 2 as "C1," "C2," . . . , "Cn"). In an example, the polymer capacitors are connected in parallel and store the sufficient energy to supply the power for the data protection from power loss.

The power controller 220 additionally manages various aspects of maintaining the capacitor array. In particular, the power controller 220 performs a voltage maintaining process by recharging the capacitor array 210 from, for instance, the power source (e.g., at the voltage Vin) whenever the voltage across the capacitor array 220 drops below a certain level. An example of the voltage maintaining process is illustrated in connection with FIG. 3. In addition, the power controller 220 can support operations for checking the health of the capacitor array 210.

The capacitor array 210 is typically checked periodically (e.g., daily) for the certainty of its health. Existing methods involve measuring total capacitance of the capacitor array 210 and comparing the measured with a preset minimum capacitance criteria. The comparison result can be expressed in a percentage value to proportionally indicate how healthy the capacitor array 210 is.

The capacitors (e.g., polymer capacitors) of the capacitor array 210 can have unique failure mechanisms and structural issues related to, for instance, internal isolation layer deterioration over time. These failure mechanisms and/or structural issues can cause larger leakage current than usual. When the capacitor leakage current develops to a certain level in a capacitor, an avalanche event might be triggered, resulting in a shorted circuit across the capacitor. Because the capacitors are connected, one shorted-circuit capacitor causes the whole capacitor array 210 to be electrically shorted to the printed circuit board (PCB) ground. The SSD 200 with such a failure loses the data protection capability when the main power is suddenly removed. Such a failure is also not necessarily reflected by the capacitance change until the avalanche event occurs. Therefore, detecting the shorted-circuit in advance by monitoring the leakage current change can supplement the monitoring of the capacitance of the capacitor array 210 and provides technical advantages related to monitoring the health of the capacitor array 210 to proactively anticipate the failure. Monitoring the leakage current is further described in connection with FIGS. 4-7.

This invention proposes an improved method to check the Polymer Capacitor Array health by monitoring the leakage resistance, in combination with the capacitance monitoring.

Figure 3:
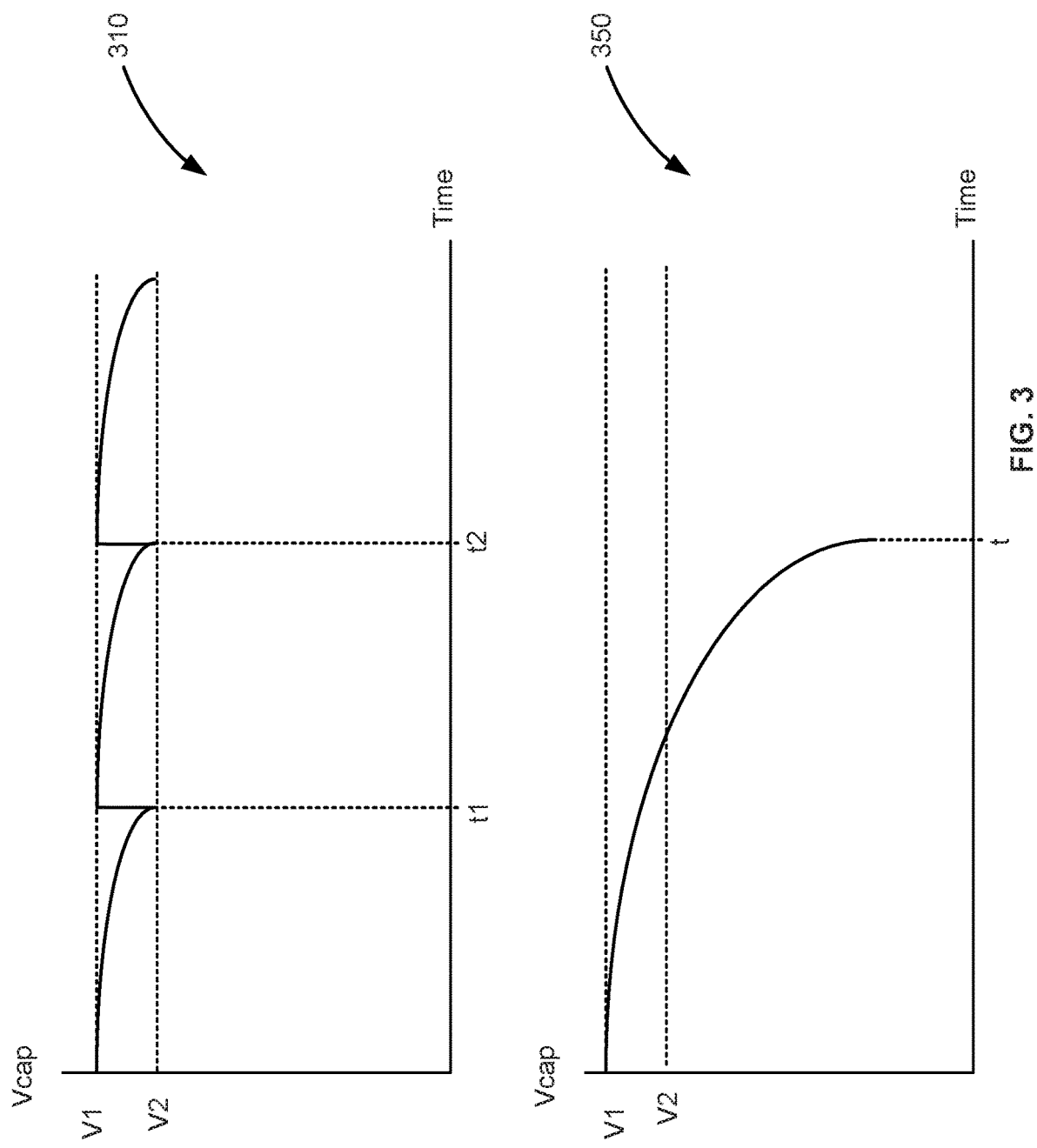
FIG. 3 illustrates an example of a voltage maintaining process and an example of a voltage discharge process for a capacitor array of an SSD, in accordance with certain embodiments of the present disclosure.

FIG. 3 illustrates an example of a voltage maintaining process 310 and an example of a voltage discharge process 350 for a capacitor array of an SSD, in accordance with certain embodiments of the present disclosure. The capacitor array here is an example of the capacitor array 210 of FIG. 2.

In particular, FIG. 3 illustrates the change to the voltage across the capacitor array (shown as "Vcap") over time when the voltage maintaining process 310 is performed and when the voltage discharge process 350 is performed. For example, after an SSD, such as the SSD 200 of FIG. 2, is powered up, a power controller, such as the power controller 220 of FIG. 2, charges up the capacitor array to a designed voltage level (shown as "V1" in FIG. 3), such as to 28 VDC or some other predefined voltage level. In other words, the voltage Vcap is set to V1. The voltage Vcap drops over time due to the leakage current internally to the capacitor array (e.g., to one or more of the capacitors of the capacitor array). Once the voltage Vcap drops below a predefined voltage level (shown as "V2" in FIG. 3), such as 27 VDC, the power controller charges up again the capacitor array to the designed voltage level (e.g., back to V1). Hence, and as illustrated, immediately after the voltage Vcap drops at a first time t1 to V2, the power controller charges the capacitor array back to V1. This recharging is repeated at a second time t2 when the voltage Vcap drops again to V2, and so on and so forth. The voltage maintaining process 310 can be enabled by electrically coupling at the relevant times (e.g., t1, t2, etc.) the capacitor array (e.g., via switches and DC converters as applicable) with an input voltage line (e.g., a 5 VDC or 12 VDC voltage line).

The voltage maintaining process 310 can also be disabled by opening the switch(es) to the power sources even when the voltage Vcap drops to or below the predefined voltage level V2. Disabling the voltage maintaining process 310 results in the voltage discharge process 350. In particular, the voltage Vcap is initially at the V1 designed voltage level, but drops over time to well below the predefined voltage level V2 and the capacitor array is not recharged. The voltage Vcap can ultimately decay to 0V. In an example, when the voltage discharge process 350 is enabled, a capacitance check discharge circuit, such as one including a resistor, becomes electrically coupled (e.g., via a switch) with the capacitor array to discharge power from the capacitor array.

An observation can be made from the representation of the voltage maintaining process 310 as illustrated in FIG. 3. In particular, the more frequently the voltage maintaining process is repeated (e.g. the smaller the time difference between the recharging times, such as the difference between t1 and t2), the larger the leakage current is. Hence, an indirect leakage current check can be performed based on the frequency of the voltage maintaining process. For instance, the number of times the voltage maintaining process 310 is performed within a predetermined time duration can be counted. If that number exceeds a predefined number threshold, leakage current is likely to be occurring. In another illustration, the time difference between the recharging can be monitored over time. If the average time difference within the predetermined time duration or, if the time difference at any point in time, becomes shorter than a predefined time threshold, leakage current is likely to be occurring. The thresholds and time duration can be empirically developed (e.g., based on laboratory testing) and set in firmware executable by a processor of the SSD.

Figure 4:
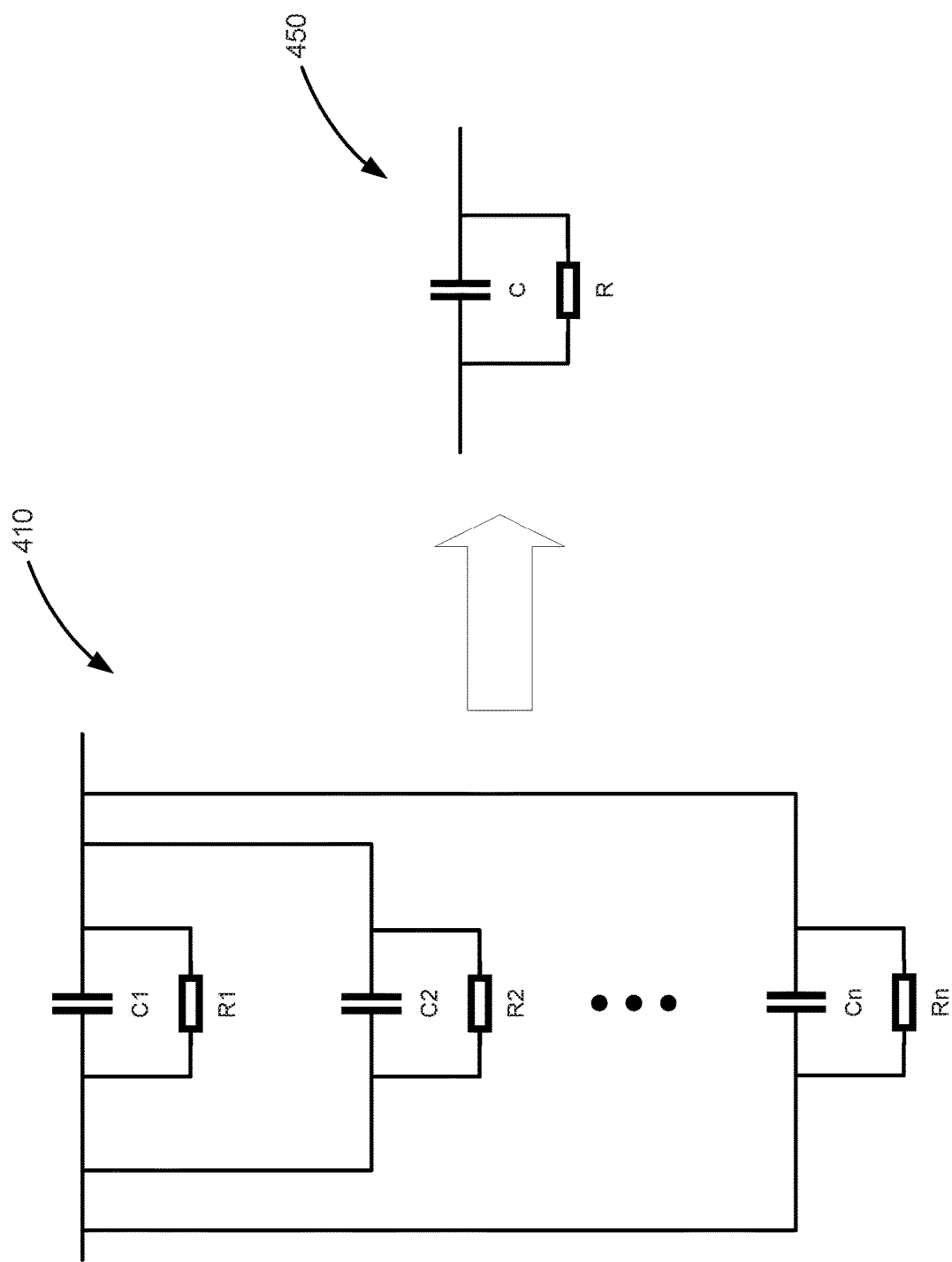
FIG. 4 illustrates an example of a representation of a capacitance of a capacitor array of an SSD, in accordance with certain embodiments of the present disclosure.

FIG. 4 illustrates an example of a representation of a capacitance of a capacitor array 410, in accordance with certain embodiments of the present disclosure. The capacitor array 410 is an example of the capacitor array 210 of FIG. 2. A capacitor, such as a polymer capacitor, of the capacitor array 410 can be represented by an ideal capacitor in parallel with a resistor to form the internal leakage current path. The resistance varies depending on the leakage current amount for a specific capacitor. Smaller resistance means larger leakage current, and vice versa.

In an example, the capacitor array 410 includes multiple capacitors connected in parallel. Each of the capacitors is represented by an ideal capacitor (shown as "C1," "C2,", . . . , "Cn") and a resistor (shown as "R1," "R2,", . . . "Rn"). The capacitor array 410 can be represented as a single larger capacitor 450 that has an ideal capacitor "C" in parallel with a resistor "R." The capacitance of "C" can be monitored over time. In addition, the resistance of "R" can be measured over time as a way of monitoring the leakage current.

In an example of measuring the resistance of R to monitor the current leakage, the capacitor array voltage (e.g., Vcap) can be expressed as:

$$v_c(t) = v_c(0)e^{-t/RC} \qquad \text{Equation 1,}$$

where, $v_c(0)$ is the initial charged voltage of the capacitor array, C is the total array capacitance, and R is the total leakage path resistance, while $$C = C1 + C2 + \ldots Cn \qquad \text{Equation 2, and}$$

$$R = R1 // R2 // \ldots Rn \qquad \text{Equation 3,}$$

From Equation 4, the leakage resistance can be deduced as $$R = \frac{t}{C(\ln v_c(0) - \ln v_c(t))}. \qquad \text{Equation 4}$$

Equation 4 can be used to directly calculate the leakage resistance R for the leakage current monitoring. The current leakage is generally inversely proportional to the leakage resistance R.

FIGS. 5-8 illustrate example flows for monitoring a health of a capacitor array of an SSD. The capacitor array and the SSD are examples of any of the capacitor array and SSD, respectively, described in connection with the previous figures. The SSD is described as performing particular operations of the example flows 500-800. Components of the SSD, such as a processor and a power controller, can be configured via software and/or hardware to perform some or all of the operations. Further, although the operations are illustrated in a particular order, other arrangement of the operations are possible and some of the operations may be skipped as it would be apparent to a person skilled in the art.

Figure 5:
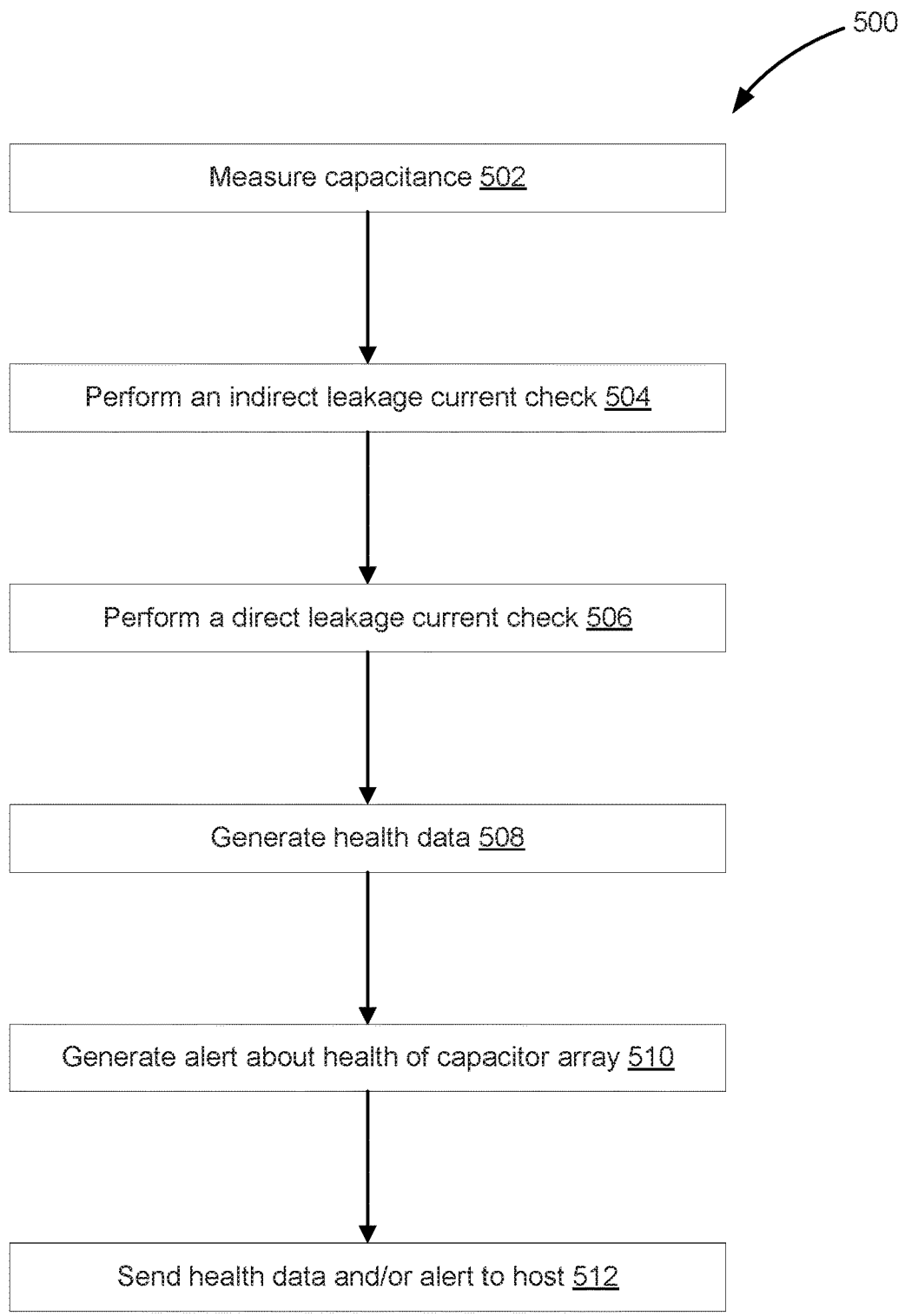
FIG. 5 illustrates an example of a flow for monitoring a health of a capacitor array of an SSD, in accordance with certain embodiments of the present disclosure.

FIG. 5 illustrates an example of a flow 500 for monitoring a health of the capacitor array of the SSD, in accordance with certain embodiments of the present disclosure. The flow 500 includes performing a capacitance check, an indirect leakage current check, and a direct leakage current check.

Figure 6:
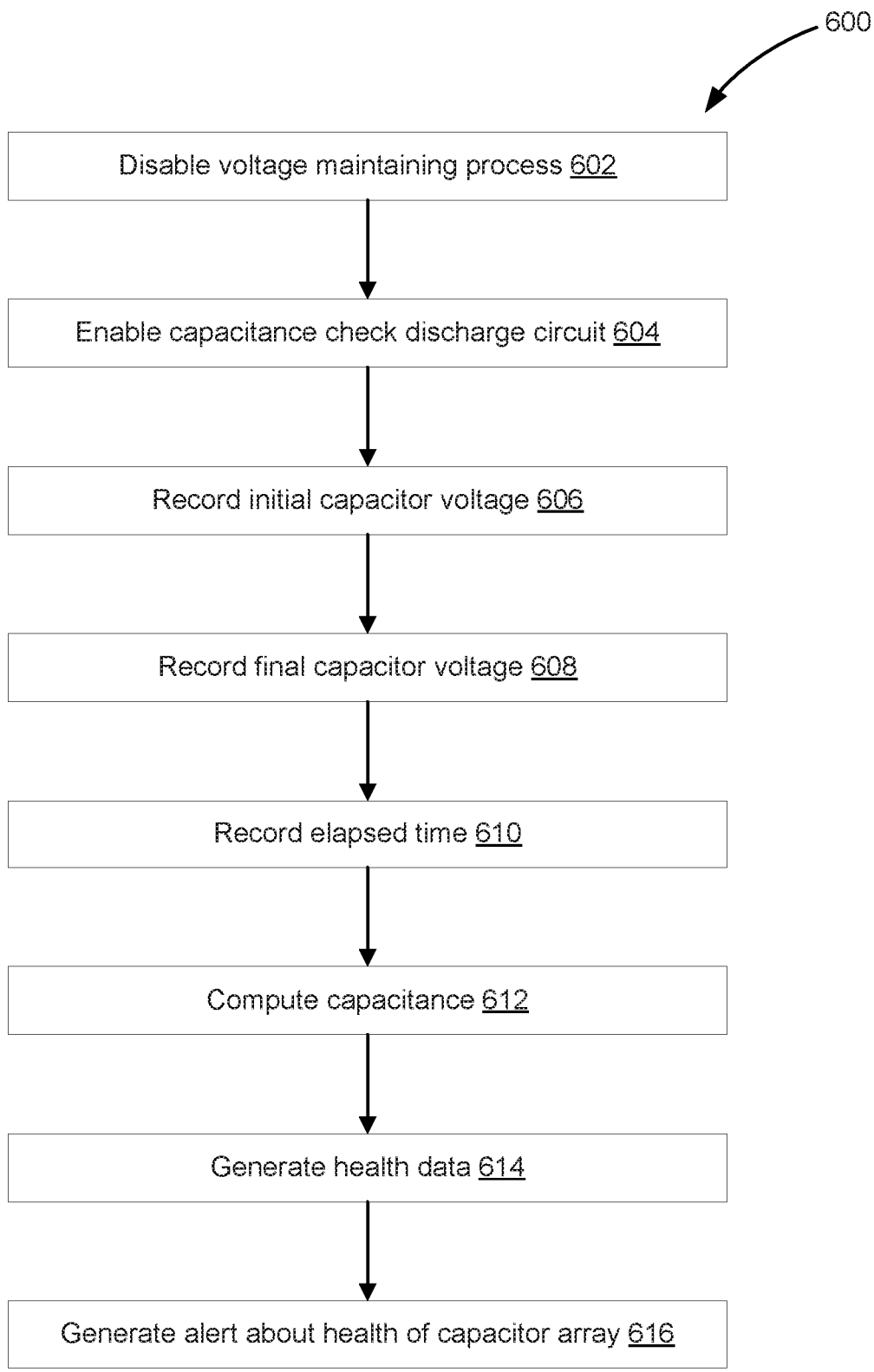
FIG. 6 illustrates an example of a flow for measuring a capacitance of a capacitor array of an SSD as part of monitoring a health of the capacitor array, in accordance with certain embodiments of the present disclosure.

In an example, the flow 500 starts at operation 502, where the SSD measures a capacitance of the capacitor array. The flow 600 of FIG. 6 illustrates sub-operations of operation 502 of the flow 500.

Figure 7:
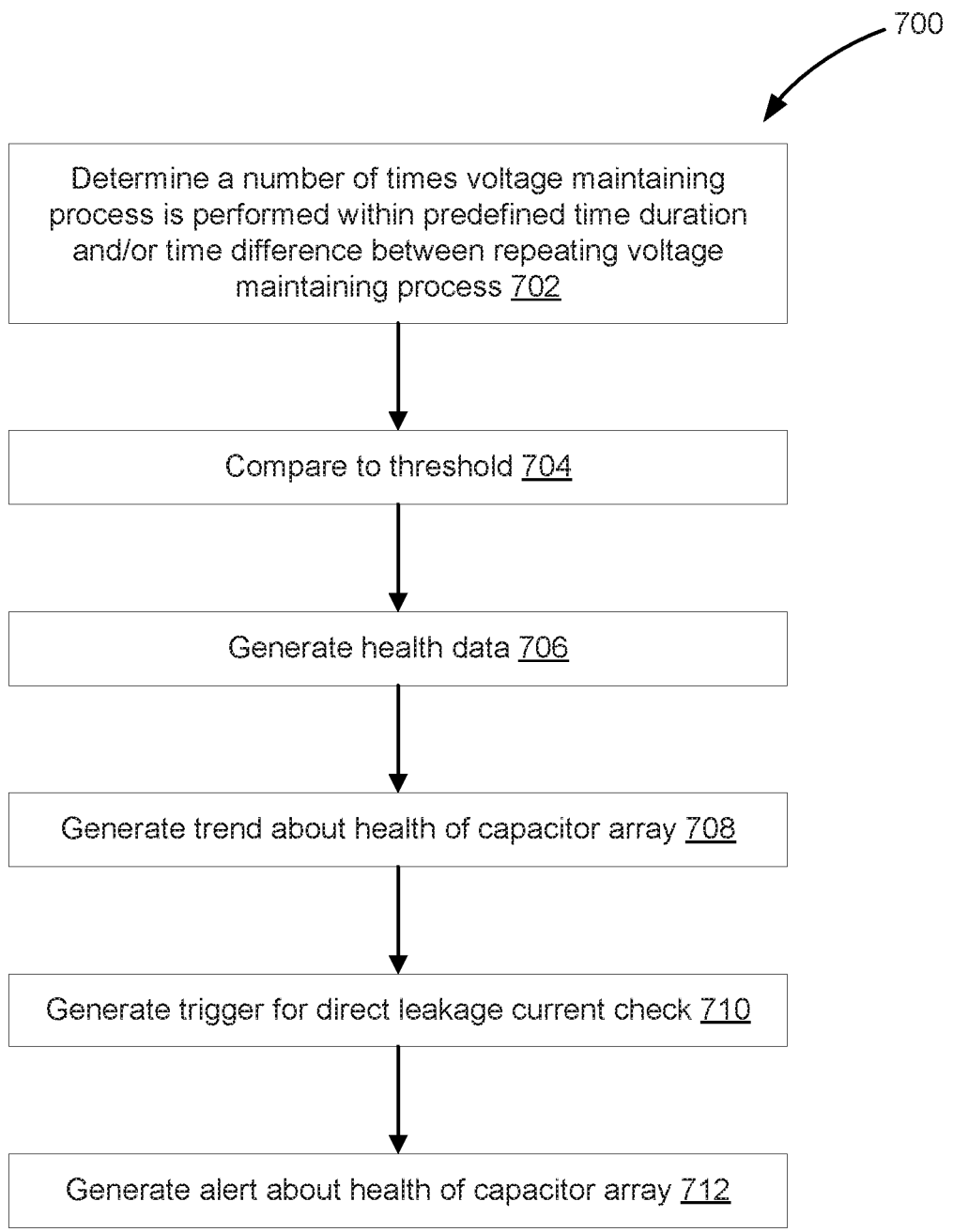
FIG. 7 illustrates an example of a flow for measuring indirect leakage current of a capacitor array of an SSD as part of monitoring a health of the capacitor array, in accordance with certain embodiments of the present disclosure.

At operation 504, the SSD performs an indirect leakage current check. The flow 700 of FIG. 7 illustrates sub-operations of operation 504 of the flow 500.

Figure 8:
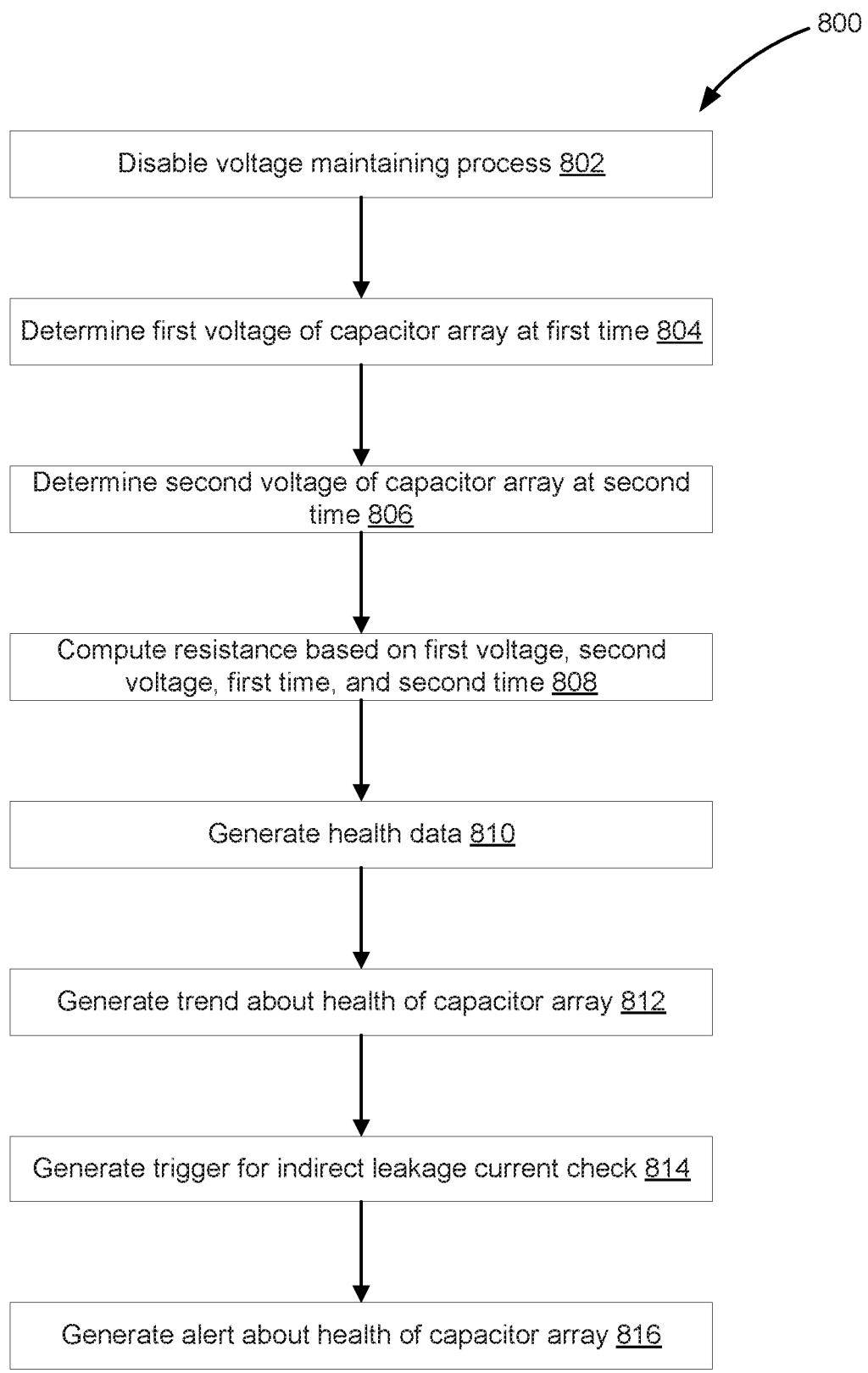
FIG. 8 illustrates an example of a flow for measuring direct leakage current of a capacitor array of an SSD as part of monitoring a health of the capacitor array, in accordance with certain embodiments of the present disclosure.

At operation 506, the SSD performs a direct leakage current check. The flow 800 of FIG. 8 illustrates sub-operations of operation 506 of the flow 500.

At operation 508, the SSD generates health data. In an example, the health data includes the measured capacitance, a number of times a voltage maintaining process is performed within a time duration (the count of the times t1, t2, etc. of FIG. 3 falling within the time duration), a time difference between the voltage maintaining process being repeated (e.g., the time difference between t2 and t1 of FIG. 3), and/or a leakage resistance.

At operation 510, the SSD generates an alert about a health of the capacitor array. In an example, the alert can be generated based on any or a combination of the measured capacitance, the number of times the voltage maintaining process is performed within a time duration, the time difference between the voltage maintaining process being repeated, and the leakage resistance. For instance, if the measured capacitance is below a capacitance threshold, the alert is generated and indicates that the capacitance of the capacitor array is no longer acceptable. If the number of times is below a number threshold, the alert is generated. If the number of times is below a number threshold, the alert is generated and indicates that the current leakage is likely occurring. If the time difference is over a time threshold, the alert is generated and indicates that the current leakage is likely occurring. If the leakage resistance is below a resistance threshold, the alert is generated and indicates that the current leakage is likely occurring.

At operation 512, the SSD sends the health data and/or alert to a host. If the health data is sent, the host can generate the alert. Otherwise, the host can receive and present the alert at a user interface. The presentation of the alert can trigger a corrective action, such as the replacement of the SSD.

FIG. 6 illustrates an example of a flow 600 for measuring a capacitance of the capacitor array of the SSD as part of monitoring a health of the capacitor array, in accordance with certain embodiments of the present disclosure. In an example, the flow 600 starts at operation 602, where the SSD disables the voltage maintaining process. For instance, the processor sends a command to the power controller to disable the voltage maintaining process in support of measuring the capacitance of the capacitor array. The command can be sent on a periodic basis, such as daily, to perform a capacitance check. In response, the power controller can open a switch to electrically decouple the capacitor array from a power source.

At operation 604, the SSD enables a capacitance check discharge circuit. For example, the capacitance check discharge circuit includes a resistor. Enabling the capacitance check discharge circuit includes the power controller closing a switch to electrically couple the resistor to the power the capacitor array. Accordingly, power is discharged from the capacitor array to the resistor.

At operation 606, the SSD records an initial capacitor voltage. In an example, the initial capacitor voltage is a measured voltage. In particular, the power controller measures the voltage across the capacitor array at the time the capacitance check discharge circuit is enabled. The measured voltage can be stored as a voltage value by the power controller in a register and the processor can access the voltage value from the register. In another example, the initial capacitor voltage can correspond to a predesigned voltage level for recharging the capacitor array as part of the voltage maintaining process (e.g., 28 VDC). In this example, the initial voltage need not be measured and can instead be presumed to equal the predesigned voltage level. In both examples, the power controller can store a first timestamp representing the time the voltage was measured or the capacitance check discharge circuit was enabled as applicable.

At operation 608, the SSD records a final capacitor voltage. In an example, the final capacitor voltage corresponds to a predefined voltage level (e.g., 26 VDC). The power controller repeatedly or continuously measures the voltage across the capacitor array until detecting that the voltage reached the predefined voltage level. The power controller determines and records, in the register as a second timestamp, the time the voltage reached the predefined level and optionally records the measured voltage at that time. The processor can access the second timestamp from the register.

At operation 610, the SSD records the elapsed time between the voltage across the capacitor array being at the initial capacitor voltage and dropping to the final capacitor voltage. For instance, the elapsed time is recorded as the first timestamp and the second timestamp. The processor can compute the elapsed time as the difference between the two timestamps.

At operation 612, the SSD computes the capacitance of the capacitor array based on the initial capacitor voltage, the final capacitor voltage, and the elapsed time. For instance, the processor computes the capacitance as:

$$C = \frac{t}{R_{dis}(\ln v_c(0) - \ln v_c(t))}, \quad \text{Equation 5}$$

were, $R_{dis}$ is the total resistance of the capacitance discharge circuit path, $v_c(0)$ is the initial voltage, $v_c(t)$ is the final capacitor voltage, and t is the elapsed time.

At operation 614, the SSD generates health data. For example, the processor includes the capacitance in the health data. In addition, the processor can compare the capacitance to a predefined minimum capacitance to generate a capacitance percentage. The capacitance percentage can be included in the health data.

At operation 616, the SSD generates an alert about a health of the capacitor array. For example, the processor can compare the capacitance to a predefined capacitance threshold (e.g., one corresponding to the predefined minimum capacitance) or the capacitance percentage to a predefined percentage threshold (e.g., ninety-five percent). If smaller than the respective threshold, the alert is generated and can be sent to the host.

FIG. 7 illustrates an example of a flow 700 for measuring indirect leakage current of the capacitor array of the SSD as part of monitoring a health of the capacitor array, in accordance with certain embodiments of the present disclosure. The flow 700 can be performed without interrupting, disabling, or changing the performance of the voltage maintaining process. In addition, the flow 700 can be performed independently of the flows 600 and 800 or following a trigger from, for instance, the flow 800.

In an example, the flow 700 starts at operation 702, where the SSD determines at least one of a number of times the voltage maintaining process is performed within a predefined time duration (e.g., ten minutes) or a time difference between repeating the voltage maintaining process. Either or both the number of times and the time difference can be used to determine whether the current leakage is likely occurring or not. In an example, the processor sends a command to the power controller to determine the number of times and/or the time difference. The command can be sent on a periodic basis generally more frequently than the periodic basis of the capacitance check, such as hourly, to perform an indirect leakage current check.

The power controller can determine the number of times by enabling a counter to count the number of performing the voltage maintaining process within the predetermine time period. The value of the counter can be initialized to zero and increased by one every time the voltage maintaining process is performed. The power controller can disable the counter at the end of the predefined time duration. The disabling includes recording the value of the counter at that time in a register as the number of times.

The power controller can determine the time difference by generating a timestamp corresponding to every time the voltage maintaining process is performed. The difference between two consecutive timestamps represents the time difference. The power controller stores the timestamps in the register.

At operation 704, the SSD compares the at least one of the number of times or the time difference and a threshold. In an example, the comparison uses the number of times if only the number of times was recorded, uses the time difference if only the time difference was recorded, or uses any or both the number of times and the time difference if both were recorded. The threshold is a predefined number threshold (e.g., one-hundred times) usable for the comparison with the number of times. The threshold is a predefined time threshold (e.g., ten microseconds) usable for the comparison with the time difference.

As applicable, the processor compares the number of times and the predefined number threshold. If the number of times is larger than the predefined number threshold, the processor determines that the leakage current is likely occurring. The larger the difference between the number of times and the predefined number threshold is, the larger the likelihood of the leakage current is. The processor can generate the likelihood as a function of this difference, where the function can be predefined based on empirical testing.

Different techniques are available to use the time difference. In an example technique, the processor computes each time difference between consecutive time stamps (e.g., "time difference 1" between "t2" and "t1," "time difference 2" between "t3" and "t1," . . . "time difference i" between "ti+1" and "ti," etc.). In this example technique, the processor compares each time difference and the predefined time threshold. If any of the time differences is smaller than the predefined time threshold, or if the percentage of the time differences that is smaller than the predefined time threshold exceeds a predefined percentage (e.g., twenty-five percent), the processor determines that the leakage current is likely occurring. In another example technique, the processor computes an average time difference as the means of the time differences. The average time difference is compared to the predefined time threshold. If the average time difference is smaller than the predefined time threshold, the processor determines that the leakage current is likely occurring. In both example techniques, the shorter the average time difference is or the larger the percentage is, the larger the likelihood of the leakage current is. The processor can generate the likelihood as a function of the average time difference and/or percentage, where the function can be predefined based on empirical testing.

At operation 706, the SSD generates health data. For example, the processor includes the number of times, the time differences, the average time difference, and/or the percentage of the number of times that is smaller than the predefined time threshold in the health data.

At operation 708, the SSD generates a trend about the health of the capacitor array based on the health data. The trend can be used to generate an alert indicating (e.g., as a likely event) the leakage current of the capacitor array. In an example, the processor stores the health data over time. Predictive analysis, such as one using regression or inputting the health data to a machine learning algorithm, can be performed once a statistically sufficient amount of the data has been collected. If the trend indicates that the leakage current is increasing (e.g., the number of times increasing over time or the time difference decreasing over the time), the alert can be generated even before the number of times exceeding the predefined time threshold and/or the time difference becoming smaller than the predefined time threshold. In this case, the alert can indicate a future timeframe during which an unacceptable leakage current is predicted to occur.

At operation 710, the SSD generates a trigger for the direct leakage current check based on the health data and/or the trend. For example, if any of the health data and/or trend triggers an alert (e.g., the number of times larger than the predefined number threshold or the time difference being smaller that the predefined time threshold), the processor can send a command to the power controller to initiate the direct leakage current check.

At operation 712, the SSD generates an alert about a health of the capacitor array based on the health data and/or trend. For example, the processor can compare the heath data to the applicable threshold (e.g., the predefined number threshold or the predefined time threshold) to generate the alert. The processor can also determine the alert from the trend. In both cases, the processor can send the alert to the host.

FIG. 8 illustrates an example of a flow 800 for measuring direct leakage current of the capacitor array of the SSD as part of monitoring a health of the capacitor array, in accordance with certain embodiments of the present disclosure. The flow 800 can be performed independently of the flows 600 and 700 or following a trigger from, for instance, the flow 700.

In an example, the flow 800 starts at operation 802, the SSD disables the voltage maintaining process. For instance, the processor sends a command to the power controller to disable the voltage maintaining process in support of the direct leakage current check. The command can be sent on a periodic basis generally more frequent than the periodic basis of the capacitance check, such as hourly, and/or upon the trigger from the flow 700 to perform an indirect leakage current check. In response, the power controller can open a switch to electrically decouple the capacitor array from the power source.

At operation 804, the SSD determines a first voltage of the capacitor array at a first time, while the voltage maintaining process is disabled. In an example, the first voltage is a measured voltage. In particular, the power controller measures the voltage across the capacitor array at the time the voltage maintaining process is disabled. The measured voltage can be stored as a first voltage value by the power controller in the register and the processor can access the first voltage value from the register. The power controller can also store a first timestamp representing the time the voltage was measured.

At operation 806, the SSD determines a second voltage of the capacitor array at a second time, while the voltage maintaining process is disabled. In an example, the second voltage corresponds to a predefined voltage level (e.g., 26 VDC). The power controller repeatedly or continuously measures the voltage across the capacitor array until detecting that the voltage reached the predefined voltage level. The power controller determines and records, in the register as a second timestamp, the time the voltage reached the predefined level and optionally records the measured voltage at that time as a second voltage value. The processor can access the second timestamp and, optionally, the second value from the register. In another example, a time duration is predefined. After the time duration elapses starting from the time the voltage maintaining process was disabled, the power controller measures the voltage and records, in the register as the second voltage value, the measured voltage at the end of the time duration and, optionally, records a second timestamp corresponding to the end of the time duration.

At operation 808, the SSD computes a resistance of the capacitor array based on the first voltage, the second voltage, the first time, and the second time. In an example, the resistance is a leak resistance and is computed according to equation 4. The first voltage value corresponds to $v_c(0)$, the second voltage value corresponds to $v_c(t)$, and the time difference between the first timestamp and the second timestamp corresponds to the elapsed time t in equation 4. The capacitance in equation 4 is set as the predesigned capacitance of the capacitor array or, as applicable, the measured capacitance per the flow 600.

At operation 810, the SSD generates health data. For example, the processor includes the resistance, the first voltage, the second voltage, the first time, and/or the second time in the health data.

At operation 812, the SSD generates a trend about the health of the capacitor array based on the health data. The trend can be used to generate an alert indicating (e.g., as a likely event) the leakage current of the capacitor array. In an example, the processor stores the health data over time. Predictive analysis, such as one using regression or inputting the health data to a machine learning algorithm, can be performed once a statistically sufficient amount of the data has been collected. If the trend indicates that the leakage current is increasing (e.g., the resistance is becoming smaller), the alert can be generated even before the resistance becomes smaller than a predefined resistance threshold. In this case, the alert can indicate a future timeframe during which an unacceptable leakage current is predicted to occur.

At operation 814, the SSD generates a trigger for the indirect leakage current check based on the health data and/or the trend. In example, if any of the health data and/or trend triggers an alert (e.g., the resistance being smaller than the predefined resistance threshold or trending to become smaller than the predefined resistance threshold), the processor can send a command to the power controller to initiate the indirect leakage current check.

At operation 816, the SSD generates an alert about a health of the capacitor array. For example, the processor can compare the resistance to the predefined resistance threshold. If smaller than the predefined resistance threshold, the alert is generated and can be sent to the host. In another example, if the trend indicates that the resistance trending is to become smaller than the predefined resistance threshold within the future timeframe, the alert is generated, can identify the future timeframe, and can be sent to the host.

Figure 9:
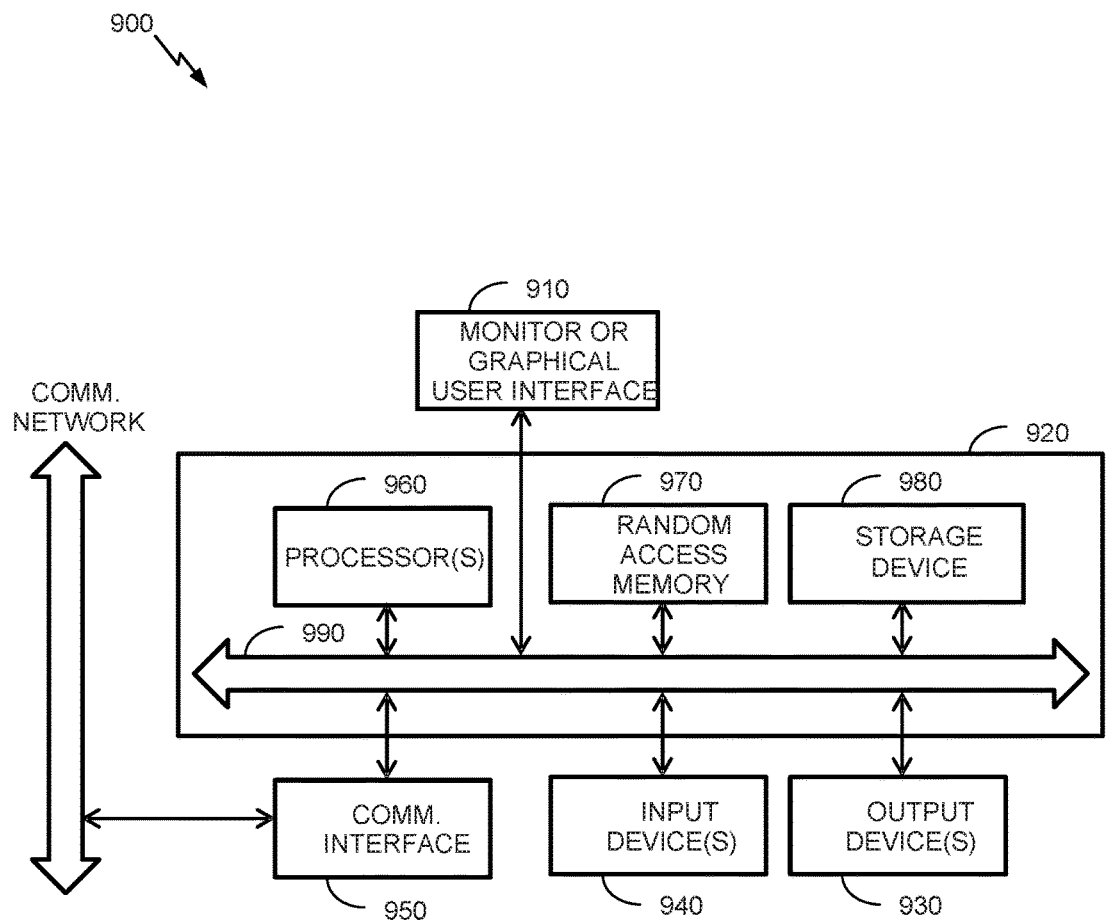
FIG. 9 is representative of a computer system capable of embodying the present disclosure.

FIG. 9 is representative of a computer system 900 capable of embodying the present disclosure, such as the error correction system 100 of FIG. 1, the host 210 and the storage device 220 of FIG. 2, and the computer system 400 of FIG. 4. FIG. 9 is merely illustrative of an embodiment of the present disclosure and does not limit the scope of the disclosure as recited in the claims. In one embodiment, the system is a computer system 900 that typically includes a monitor 910, a computer 920, user output devices 930, user input devices 940, communications interface 950, and the like. The error correction system 100 of FIG. 1 implements some or all of the components of the computer system 900.

As shown in FIG. 9, the computer 920 may include a processor(s) 960 that communicates with a number of peripheral devices via a bus subsystem 990. These peripheral devices may include the user output devices 930, the user input devices 940, the communications interface 950, and a storage subsystem, such as random access memory (RAM) 970 and a storage device 980.

The user input devices 940 include all possible types of devices and mechanisms for inputting information to the computer system 920. These may include a keyboard, a keypad, a touch screen incorporated into the display, audio input devices such as voice recognition systems, microphones, and other types of input devices. In various embodiments, the user input devices 940 are typically embodied as a computer mouse, a trackball, a track pad, a joystick, a wireless remote, a drawing tablet, a voice command system, an eye tracking system, and the like. The user input devices 940 typically allow a user to select objects, icons, text and the like that appear on the monitor 910 via a command such as a click of a button or the like.

The user output devices 930 include all possible types of devices and mechanisms for outputting information from the computer 920. These may include a display (e.g., the monitor 910), non-visual displays such as audio output devices, etc.

The communications interface 950 provides an interface to other communication networks and devices. The communications interface 950 may serve as an interface for receiving data from and transmitting data to other systems. Embodiments of the communications interface 950 typically include an Ethernet card, a modem (telephone, satellite, cable, ISDN), (asynchronous) digital subscriber line (DSL) unit, FireWire interface, USB interface, and the like. For example, the communications interface 950 may be coupled to a computer network, to a FireWire bus, or the like. In other embodiments, the communications interfaces 950 may be physically integrated on the motherboard of the computer 920, and may be a software program, such as soft DSL, or the like.

In various embodiments, the computer system 900 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 920 includes one or more Xeon microprocessors from Intel as the processor(s) 960. Further, one embodiment, the computer 920 includes a UNIX-based operating system.

The RAM 970 and the storage device 980 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 970 and the storage device 980 may be configured to store the basic programming and data constructs that provide the functionality of the present disclosure.

Software code modules and instructions that provide the functionality of the present disclosure may be stored in the RAM 970 and the storage device 980. These software modules may be executed by the processor(s) 960. The RAM 970 and the storage device 980 may also provide a repository for storing data used in accordance with the present disclosure.

The RAM 970 and the storage device 980 may include a number of memories including a main random access memory (RAM) for storage of instructions and data during program execution and a read-only memory (ROM) in which fixed non-transitory instructions are stored. The RAM 970 and the storage device 980 may include a file storage subsystem providing persistent (non-volatile) storage for program and data files. The RAM 970 and the storage device 980 may also include removable storage systems, such as removable flash memory.

The bus subsystem 990 provides a mechanism for letting the various components and subsystems of the computer 920 communicate with each other as intended. Although the bus subsystem 990 is shown schematically as a single bus, alternative embodiments of the bus subsystem may utilize multiple busses.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc., and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A solid-state drive (SSD) comprising:
a power controller;
a capacitor array; and
a processor configured to execute instructions that cause the SSD to:
determine at least one of: a number of times a voltage maintaining process is performed within a predefined time duration or a time difference between repeating the voltage maintaining process, the voltage maintaining process comprising a recharging of the capacitor array by the power controller;
compare the at least one of the number of times or the time difference and a threshold;
disable the voltage maintaining process;
determine, while the voltage maintaining process is disabled, a first voltage of the capacitor array at a first time;
determine, while the voltage maintaining process is disabled, a second voltage of the capacitor array at a second time;
compute a resistance of the capacitor array based on the first voltage, the second voltage, the first time, and the second time; and
generate health data for the capacitor array based on at least one of the resistance or a result of the comparison of the at least one of the number of times or the time difference and the threshold.

2. The SSD of claim 1, wherein the health data comprises the resistance and the at least one of the number of times or the time difference, and wherein the execution of the instructions further cause the SSD to:
compare the resistance to another threshold; and
generate an alert indicating a leakage current of the capacitor array based on at least one of the resistance being smaller than the other threshold or the at least one of the number of times or the time difference being larger than the threshold.

3. The SSD of claim 1, wherein determining the first voltage comprises measuring the first voltage at a time of disabling the voltage maintaining process, wherein determining the second voltage comprises determining that the first voltage dropped to a predefined voltage level, and wherein a difference between the second time and the first time is measured as an elapsed time.

4. The SSD of claim 3, wherein the resistance is computed as a function of the elapsed time, a capacitor of an ideal capacitor that represents the capacitor array, the first voltage, and the predefined voltage level.

5. The SSD of claim 1, wherein disabling the voltage maintaining process is based on the comparison of the at least one of the number of times or the time difference and the threshold indicating that the number of times is larger than the threshold or the time difference is smaller than the threshold.

6. The SSD of claim 1, wherein the capacitor array comprises polymer capacitors.

7. A method implemented by a storage device, the method comprising:
determining a first voltage of a capacitor array of the storage device at a first time;
determining a second voltage of the capacitor array at a second time;
computing a resistance of the capacitor array based on the first voltage, the second voltage, the first time, and the second time; and
generating health data for the capacitor array based on the resistance.

8. The method of claim 7, wherein the first voltage and the second voltage are determined while a voltage maintaining process is disabled, the voltage maintaining process comprising a recharging of the capacitor array by a power controller of the storage device.

9. The method of claim 8, wherein determining the first voltage comprises measuring the first voltage at a time of disabling the voltage maintaining process, wherein determining the second voltage comprises determining that the first voltage dropped to a predefined voltage level, and wherein a difference between the second time and the first time is measured as an elapsed time.

10. The method of claim 9, wherein the resistance is computed as a function of the elapsed time, a capacitor of an ideal capacitor that represents the capacitor array, the first voltage, and the predefined voltage level.

11. The method of claim 7, wherein the health data comprises the resistance, and wherein the method further comprises:
comparing the resistance and a threshold; and
generating an alert indicating a leakage current of the capacitor array based on the comparison.

12. The method of claim 7, wherein the first voltage and the second voltage are determined while a voltage maintaining process is disabled, and wherein the method further comprises:
determining at least one of: a number of times the voltage maintaining process is performed within a predefined time duration or a time difference between repeating the voltage maintaining process, the voltage maintaining process comprising a recharging of the capacitor array by a power controller; and
comparing the at least one of the number of times or the time difference and a threshold.

13. The method of claim 12, wherein generating the health data is further based on the comparing of the number of times and the threshold, and wherein the method further comprises:
generating an alert indicating a leakage current of the capacitor array based on at least one of the resistance being smaller than another threshold or the number of times being larger than the threshold.

14. The method of claim 12, wherein the method further comprises:
disabling the voltage maintaining process based on the number of times being larger than the threshold.

15. The method of claim 7, further comprising:
generating a trend about a health of the capacitor array based on the health data; and
generating an alert indicating a leakage current of the capacitor array based on the trend.

16. One or more non-transitory computer-readable storage media storing instructions that, upon execution on a storage device, cause the storage device to perform operations comprising:
determining at least one of: a number of times a voltage maintaining process is performed within a predefined time duration or a time difference between repeating the voltage maintaining process, the voltage maintaining process comprising a recharging of a capacitor array of the storage device by a power controller of the storage device;

comparing the at least one of the number of times or the time difference and a threshold; and generating health data for the capacitor array based on the comparison of the at least one of the number of times or the time difference and the threshold.

17. The one or more non-transitory computer-readable storage media of claim 16, wherein the operations further comprises:

generating an alert indicating a leakage current of the capacitor array based on the number of times being larger than the threshold or the time difference being smaller than the threshold.

18. The one or more non-transitory computer-readable storage media of claim 16, wherein the operations further comprise:

disabling the voltage maintaining process;

determining, while the voltage maintaining process is disabled, a first voltage of the capacitor array at a first time;

determining, while the voltage maintaining process is disabled, a second voltage of the capacitor array at a second time; and computing a resistance of the capacitor array based on the first voltage, the second voltage, the first time, and the second time, wherein generating the health data is further based on the resistance.

19. The one or more non-transitory computer-readable storage media of claim 18, wherein the voltage maintaining process is disabled based on the number of times being larger than the threshold or the time difference being smaller than the threshold.

20. The one or more non-transitory computer-readable storage media of claim 16, wherein the health data comprises the number of times, and wherein the operations further comprise:

generating a trend about a health of the capacitor array based on the health data; and generating an alert indicating a leakage current of the capacitor array based on the trend.

* * * * *